(12) United States Patent
Long et al.

(10) Patent No.: US 6,225,669 B1
(45) Date of Patent: May 1, 2001

(54) NON-UNIFORM GATE/DIELECTRIC FIELD EFFECT TRANSISTOR

(75) Inventors: Wei Long, Sunnyvale; Yowjuang William Liu, San Jose; Don Wollesen, Saratoga, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/163,840

(22) Filed: Sep. 30, 1998

(51) Int. Cl.$^7$ .................................................. H01L 29/76
(52) U.S. Cl. .......................... 257/401; 257/221; 257/327; 257/394; 257/395; 257/406; 257/411; 257/506; 257/547; 257/638; 438/264; 438/271; 438/286
(58) Field of Search ................................ 257/401, 394, 257/395, 221, 406, 411, 547, 638, 506, 327; 438/264, 271, 286

(56) References Cited

U.S. PATENT DOCUMENTS

| | | |
|---|---|---|
| 5,257,095 | 10/1993 | Liu et al. . |
| 5,314,834 * | 5/1994 | Mazure et al. ........................ 437/43 |
| 5,686,329 | 11/1997 | Chang et al. . |
| 5,741,737 * | 4/1998 | Kachelmeier ........................ 438/286 |
| 5,811,341 * | 9/1998 | Davies et al. ........................ 438/279 |

OTHER PUBLICATIONS

International Electron Meeting 1997: Washington, D.C. Dec. 7–10, 1997; Dual Material Gate Field Effect Transistor (DMGFET) by Wei Long and Ken K. Chin; p. 549–552.

* cited by examiner

Primary Examiner—Eddie C. Lee
Assistant Examiner—Matthew E. Warren
(74) Attorney, Agent, or Firm—Renner, Otto, Boisselle & Sklar, LLP

(57) ABSTRACT

A field effect transistor (FET) structure, and method for making the same, which further suppresses short-channel effects based on variations within the gate dielectric itself. The FET structure utilizes non-uniform gate dielectrics to alter the vertical electric field presented along the channel. The thickness and/or dielectric constant of the gate dielectric is varied along the length of the channel to present a vertical electric field which varies in a manner that tends to reduce the short-channel effects and gate capacitances.

21 Claims, 7 Drawing Sheets

NON-UNIFORM GATE/DIELECTRIC FIELD EFFECT TRANSISTOR

TECHNICAL FIELD

The present invention relates generally to field effect transistors (FETs), and more particularly to an FET with non-uniform gate/dielectric characteristics.

BACKGROUND OF THE INVENTION

The field effect transistor (FET) is well known as a fundamental component of a large variety of integrated circuits. As with integrated circuits in general, two primary goals with respect to the ongoing development of FETs are reduced size and increased speed of operation. The reduction or scaling in size has necessarily led to shorter channel lengths.

It has been found that with process technology improved to the point where devices can be fabricated with channel lengths smaller than 2 μm FET devices began to exhibit phenomena not predicted by long-channel models. Such phenomena have since been termed "short-channel" effects. These short-channel effects are oftentimes undesirable and have become a major limiting factor in the scaling of FETs. For example, short-channel effects include increased dependence of the saturation drain current vs. the channel length variation; increased leakage current when the FET is in the "off" condition; and reliability problems. (See, e.g., S. Wolf, *Silicon Processing for the VLSI Era*, Vol. 3, Chap. 5, Lattice Press (1995), for discussion on short-channel effects).

The conventional approach to suppressing short-channel effects involves device engineering in the semiconductor substrate (e.g., silicon) underneath the gate dielectrics. For example, various techniques such as lightly doped drain (LDD), shallow junction, pocket ion implantation, etc. have been utilized.

Nevertheless, there is a strong need in the art for further improvements in suppressing short-channel effects in FETs. There is a strong need for a technique which goes beyond device engineering underneath the gate dielectric. In particular, there is a strong need in the art for an FET structure and method of making the same which enables even further reduction in size substantially without detriment due to short-channel effects.

SUMMARY OF THE INVENTION

The present invention relates to an FET structure, and method for making the same, which further suppresses short-channel effects based on designed variations within the gate dielectric itself. The FET structure utilizes a non-uniform gate dielectric to alter the vertical electric field presented along the channel. For example, the thickness and/or dielectric constant of the gate dielectric is varied along the length of the channel to present a vertical electric field which varies in a manner that tends to reduce the short-channel effects and gate capacitance.

Generally speaking, the present invention proposes a new FET structure (e.g., a metal-oxide-semiconductor FET (MOSFET)). By strategically placing the same or different gate materials above various gate dielectric materials along the channel, significant improvements in many aspects of device performance can be obtained. Since existing and emerging technologies, such as electron beam (e-beam), selective/angle ion implantation, precise lithographic alignment, etc. can be used to generate well defined asymmetric gate structures and varied gate dielectrics, such technologies are particularly suited for the making a FET in accordance with the present invention.

An FET in accordance with the present invention is typified by a structure in which the gate dielectric thickness and/or dielectric constant varies along the length of the channel. The gate dielectric may have multiple thickness and/or dielectric constant changes along the channel to optimize the device performance, reliability, manufacturability, etc.

The attributes of the new structure have been analyzed. The results indicate that the structure improves short-channel effects by stabilizing threshold voltages to a fairly constant value upon scaling. In addition, the new structure suppresses drain induced barrier lowering (DIBL) to make the structure ideal for use as a current source or an active load for analog applications. Furthermore, the structure reduces punchthrough tendencies to facilitate a reduced need in substrate doping limitations. The new structure also decreases maximum electric field along the channel to overcome reliability problems, and increases the Idsat/Idsoff ratio to provide improved performance.

According to a particular aspect of the invention, a transistor is provided which includes a semiconductor substrate; a source region and a drain region formed within the semiconductor substrate; a channel region defined within the semiconductor substrate extending between the source region and the drain region; a gate dielectric layer formed on the substrate above the channel region, the gate dielectric layer having at least one of a non-uniform thickness and a non-uniform dielectric constant along a length of the channel region; and a gate material layer formed above the gate dielectric layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF THE PREFERRED EMBODIMENTS

The present invention will now be described in detail with reference to the drawings, wherein like reference labels refer to like elements throughout.

Figure 1:
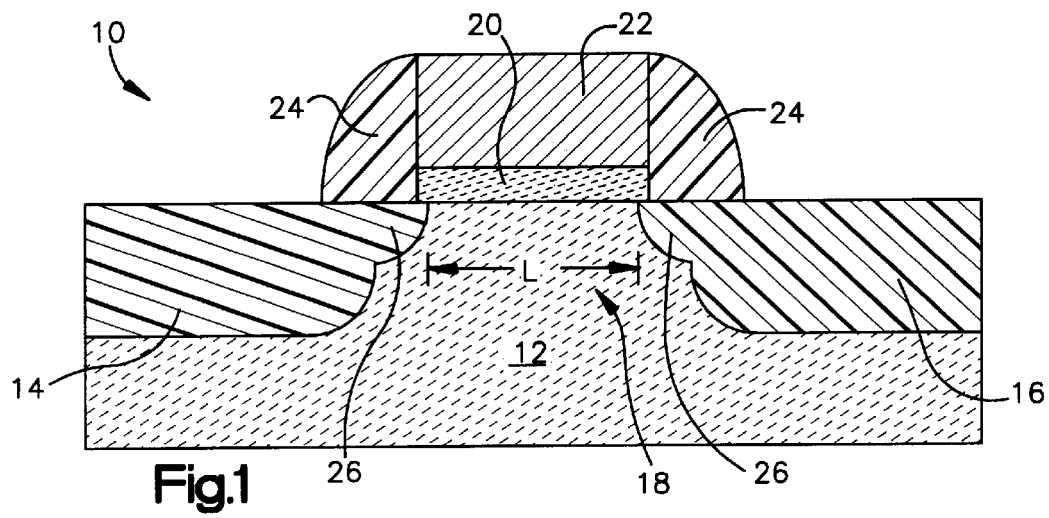
FIG. 1 is a cross-sectional view of a conventional FET structure.

Referring initially to FIG. 1, a conventional LDD-type FET structure 10 is shown. The FET 10 is formed using a semiconductor substrate 12 such as silicon. A source 14 and drain 16 are formed at the surface of the substrate 12 by implanting an n-type dopant (in the case of an N-type device) or a p-type dopant (in the case of a P-type device) in selected regions. Interposed between the source 14 and the drain 16 is a channel 18 having a length L.

The FET 10 further includes a gate dielectric 20 formed on the surface of the substrate 12 above the channel 18. The gate dielectric 20 may be made of silicon oxide, nitride or other known dielectrics. A gate material 22 is formed above the gate dielectric 22 and functions as the gate electrode. The gate material 22 may be any conventional material such as polysilicon, metals, suicides or other conductive materials. Sidewall spacers 24 are included at opposite ends of the channel 18, and are used as part of a conventional self-alignment process to form lightly-doped regions 26 in the source 14 and drain 16. The sidewall spacer materials are insulators such as silicon dioxide or silicon nitride.

As mentioned above, the LDD regions 26 help to suppress short-channel effects in the FET 10. However, it is noted that in a conventional FET such as that shown in FIG. 1 the gate dielectric 20 generally has a uniform thickness and dielectric constant. The present invention provides a variation in such structure to produce an FET with even further improved suppression of short-channel effects.

Figure 2:
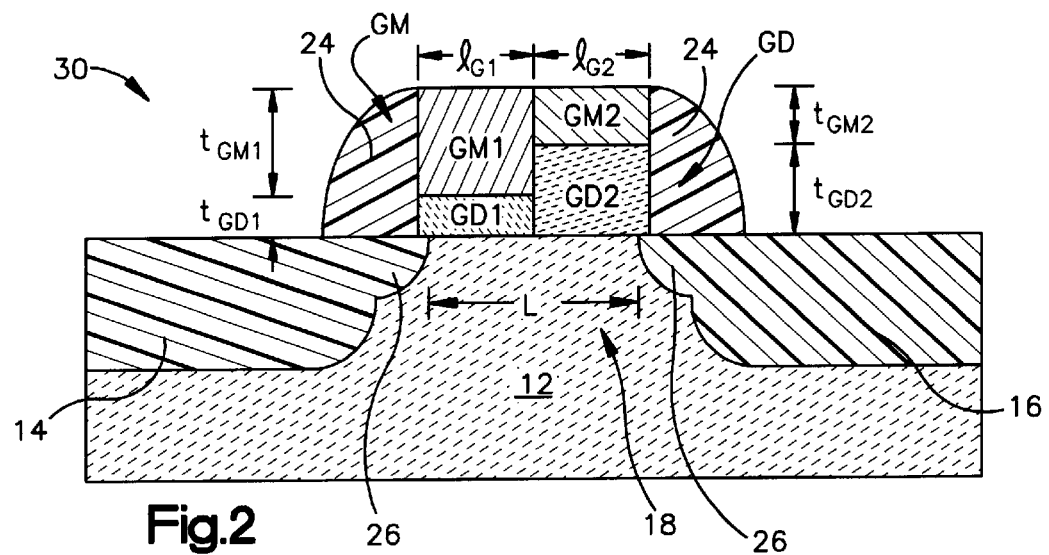
FIG. 2 is a general cross-sectional view of an FET in accordance with the present invention.

Referring now to FIG. 2, the general structure for an FET 30 in accordance with the present invention is shown. The substrate 12, source 14, drain 16, channel 18, and sidewall spacers 24 are essentially identical to those found in the conventional FET 10. Hence, the same reference numerals are utilized herein and further description is omitted for sake of brevity.

On the other hand, the gate dielectric GD and, in some cases, the gate material GM differ significantly from the gate dielectric 20 and the gate material 22. In accordance with one embodiment, the gate dielectric GD is comprised of two or more non-uniform segments (e.g., GD1 and GD2) disposed adjacent to each other along the length of the channel 18. The gate dielectric segments GD1 and GD2 can be silicon oxide, nitride, other dielectrics, or a combination thereof. The segments of the gate dielectric GD are different from each other in thickness and/or dielectric constant. By selecting an appropriate thickness and/or dielectric constant for the different segments (e.g., GD1 and GD2), it is possible to alter the vertical electric field applied along the channel via the gate material GM.

In addition, the gate material GM comprises two or more segments (e.g., GM1 and GM2) formed atop the corresponding segments of the gate dielectric GD. Like the gate dielectric segments, the gate material segments are arranged adjacent to one another along the length of the channel 18. Although not as critical as the gate dielectric segments GD, the gate material segments may have the same or different thicknesses. Moreover, the gate material segments may be made of different materials (e.g., polysilicon, tungsten, other gate materials, or a combination thereof) and hence possess different work functions as is discussed in more detail below.

FIG. 2 exemplifies the situation where the FET 30 in accordance with the present invention includes a gate dielectric GD with generally one non-uniformity in thickness and/or dielectric constant along the length of the channel 18. In another embodiment, such as that shown with respect to FIG. 3f, the FET 30 may include three adjacent gate dielectric segments with different thicknesses and/or dielectric constants. Consequently, the FET 30 as represented in FIG. 3f includes generally two non-uniformities in thickness and/or dielectric constant along the length of the channel 18. More than two non-uniformities is also possible as will be appreciated. However, for sake of simplicity, the present invention will be described primarily in the context of the general embodiment of FIG. 2. It will be readily apparent to those having ordinary skill in the art how the invention can be applied to a gate dielectric GD and/or gate material GM using three or more non-uniformities Continuing to refer to FIG. 2, the gate dielectric segments GD1 and GD2 have corresponding thicknesses $t_{GD1}$ and $t_{GD2}$. The gate material segments GM1 and GM2 have corresponding thicknesses $t_{GM}$, and $t_{GM2}$. The gate dielectric and gate material segments GD1 and GM1, respectively, each have a length $l_{G1}$ along the length L of the channel 18. The gate dielectric and gate material segments GD2 and GM2, respectively, each have a length $l_{G2}$, where the sum of $l_{G1}$ and $l_{G2}$ is equal to L.

The present invention will now be described by way of several illustrative examples. It will be appreciated, however, that such specific examples are not intended to be limiting to the scope of the invention. Rather, they are provided as an illustration of the manner in which various non-uniformities in the gate dielectric GD and the gate material GM are possible.

EXAMPLE 1

Figure 3A:
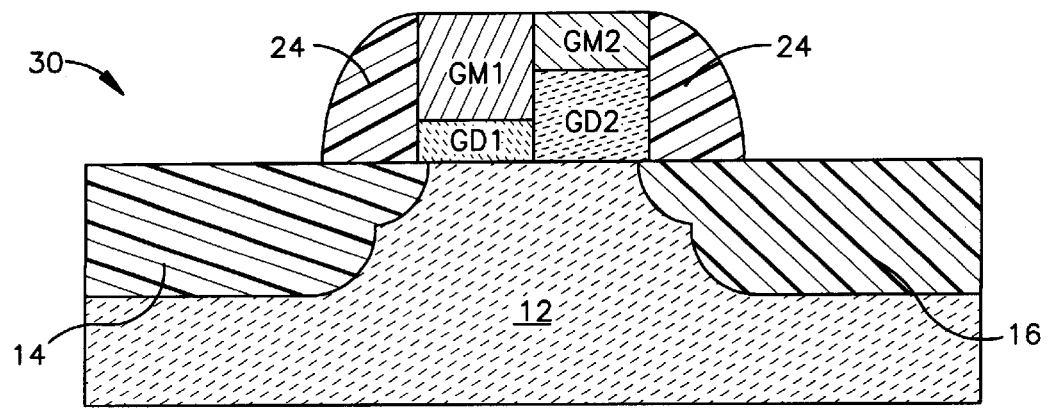
FIGS. 3a–3f are cross-sectional views showing various non-uniformities in the FET gate dielectric according to different specific examples in accordance with the present invention.

FIG. 3a illustrates a first example of an FET 30 in accordance with the present invention. The FET 30 has the same basic structure as that shown in FIG. 2. More particularly, in this specific example the gate dielectric segments GD1 and GD2 are made of the same dielectric material (e.g., silicon oxide) but have different thicknesses. Namely, the thickness $t_{GD1}$ of gate dielectric segment GD1 is less than the thickness $t_{GD2}$ of the gate dielectric segment GID2. The gate material segments GM1 and GM2 are made of the same material (e.g., polysilicon). The top surfaces of each may or may not be flush with one another; however, they are illustrated as flush as shown in FIG. 3a.

EXAMPLE 2

Figure 3B:
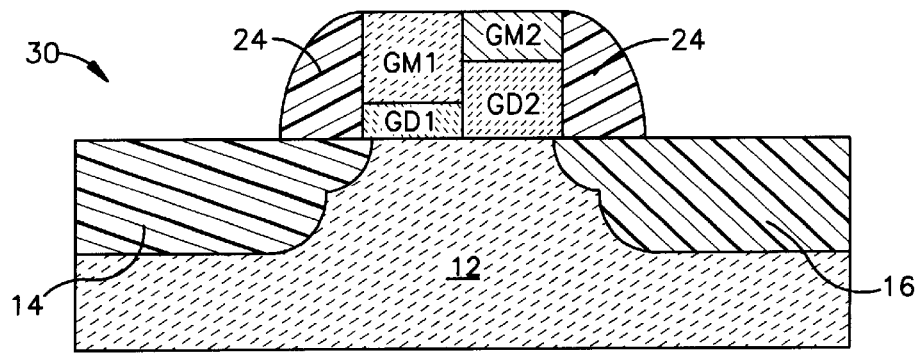

FIG. 3b illustrates a second example identical to that of Example 1 in FIG. 3a, with the exception that the gate material segments GM1 and GM2 are made of different materials (e.g., polysilicon and tungsten, respectively) with different work functions.

EXAMPLE 3

Figure 3C:
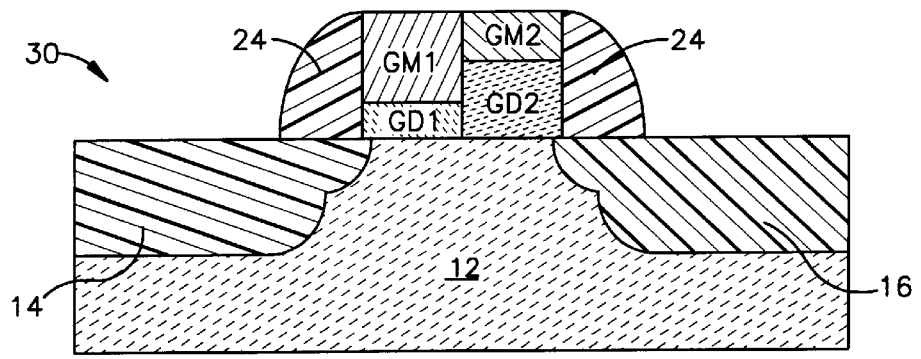

FIG. 3c represents a third example similar to that of Example 1 in FIG. 3a, except that in the present example the gate dielectric segments GD1 and GD2 are made of different materials with different dielectric constants. For example, segment GD1 may be made of silicon oxide whereas segment GD2 is made of nitride.

EXAMPLE 4

Figure 3D:
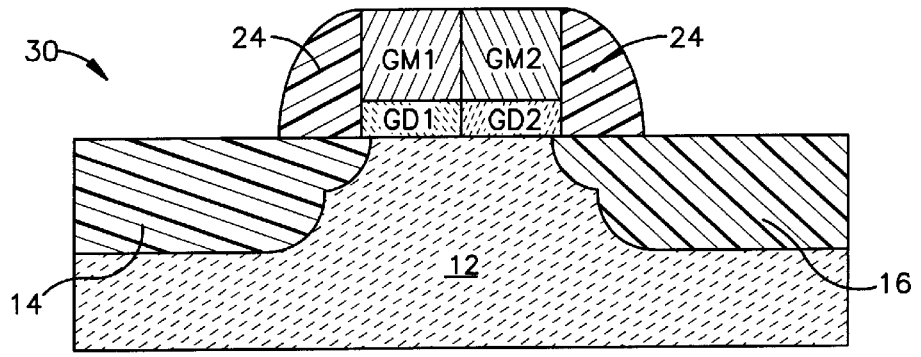

FIG. 3d illustrates a fourth example similar to that shown in FIG. 3c. However, in this particular example the gate dielectric segments GD1 and GD2 have the same thickness while being made of different materials with different dielectric constants.

EXAMPLE 5

Figure 3E:
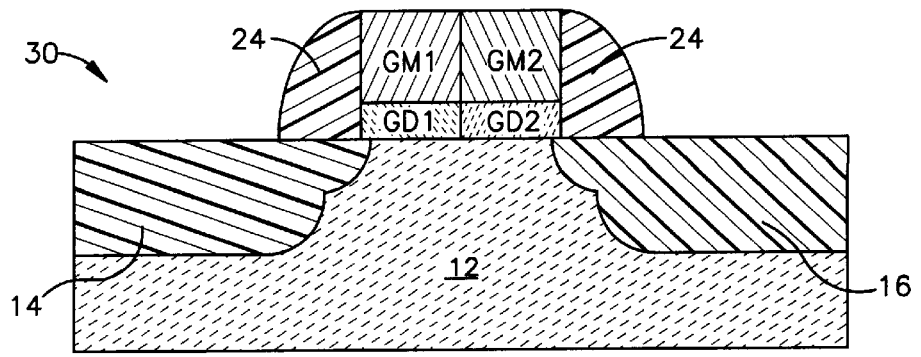
Figure 3F:
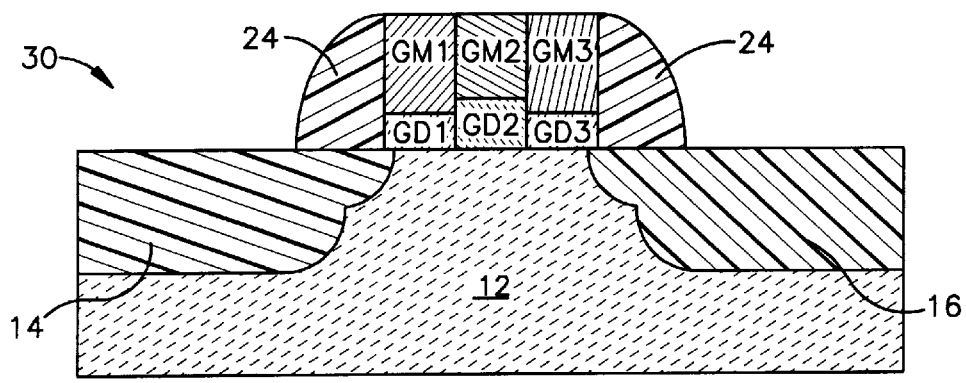

FIG. 3e presents an example similar to that of FIG. 3d (Example 4), except that the gate material segments GM1 and GM2 also are made of different materials. In this case, the gate material segments GM1 and GM2 exhibit different work functions.

Generally speaking, the thickness of the gate dielectric segments GD1 and GD2 may or may not be the same. The thickness of the gate material segments GM1 and GM2 may or may not be the same. The stack height of GM1 plus GD1 may or may not be the same as the stack height of GM2 plus GD2.

EXAMPLE 6

FIG. 3f illustrates an example where three adjacent gate dielectric segments GD1, GD2 and GD3 are formed along the length of the channel with different thicknesses and/or dielectric constants. For example, the center segment GD2 may have a larger thickness/dielectric constant than the thickness/dielectric constant of the end segments GD1 and GD3. Alternatively, the center segment GD2 may have a smaller thickness/dielectric constant than the thickness/dielectric constant of the end segments GD1 and GD3.

Guidelines

The following general guidelines are provided as exemplary for achieving favorable performance with the FET 30 in accordance with the present invention. Depending on whether the FET 30 is an N-type device (NMOS) or a P-type device (PMOS), the following guidelines are considered useful:

i)a NMOS Case 1
- decrease gate dielectric thickness from the source 14 to the drain 16 (e.g., $t_{GD1} > t_{GD2}$); and/or
- increase dielectric constant from the source 14 to the drain 16 (e.g., dielectric constant of GD1 material<dielectric constant of GD2 material); and/or
- decrease work function of gate materials from the source 14 to the drain i)b NMOS Case 2
- increase gate dielectric thickness from the source 14 to the drain 16 (e.g., $t_{GD1} < t_{GD2}$); and/or
- decrease dielectric constant from the source 14 to the drain 16 (e.g., dielectric constant of GD1 material>dielectric constant of GD2 material); and/or
- increase work function of gate materials from the source 14 to the drain ii)a PMOS Case 1
- increase gate dielectric thickness from the source 14 to the drain 16 (e.g., $t_{GD1} < t_{GD2}$); and/or
- decrease dielectric constant from the source 14 to the drain 16 (e.g., dielectric constant of GD1 material>dielectric constant of GD2 material); and/or
- increase work function of gate materials from the source 14 to the drain ii)b PMOS Case 2
- decrease gate dielectric thickness from the source 14 to the drain 16 (e.g., $t_{GD1} > t_{GD2}$); and/or
- decrease dielectric constant from the source 14 to the drain 16 (e.g., dielectric constant of GD1 material<dielectric constant of GD2 material); and/or
- decrease work function of gate materials from the source 14 to the drain iii) Both NMOS and PMOS
- minimize the transition region from one gate dielectric thickness/dielectric constant/gate material to the other or make the transition as steep as possible and to the degree that is comparable or less than the magnitude of the gate dielectric thickness
- decrease the length of materials near the source 14 (e.g., length of GD1/GM1) to improve driving current/performance
- increase the length of materials near the drain 16 (e.g., length of (GD2/GM2) to improve short- channel effects (including Vt roll-off, DIBL, punchthrough, hot carriers, etc.)
- control the gate dielectric thickness/dielectric constant/gate material near the source 14 to optimize the overall device threshold A variety of processing techniques are available for fabricating an FET 30 in accordance with the present invention. For example, FIGS. 4(1)–4(7) illustrate some basic multiple layer resist with e-beam/ion-beam, etc. processing steps for fabricating an FET with different thickness gate dielectric segments using the same or different gate dielectric materials.

Figure 4:
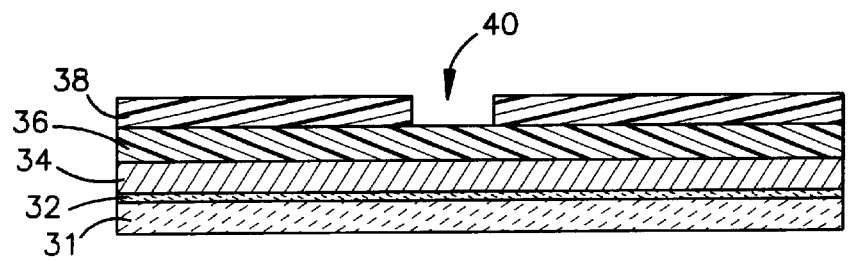
FIGS. 4(1)–4(7) represent typical process steps which are carried out using multiple layer resist processing in accordance with the present invention.
Figure 4:
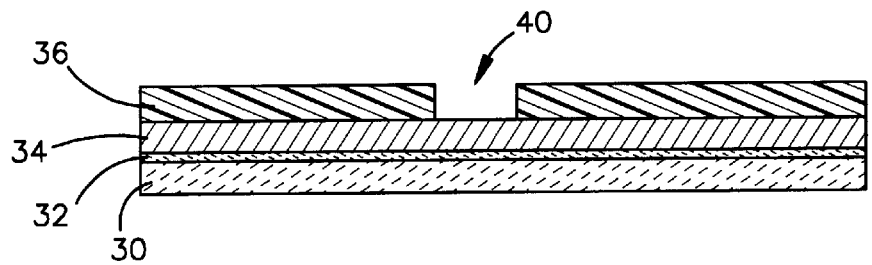
Figure 4:
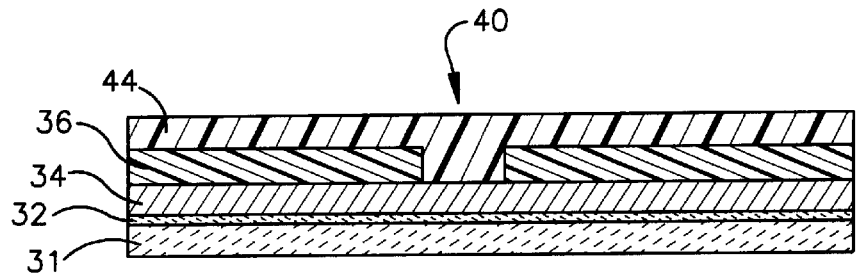
Figure 4:
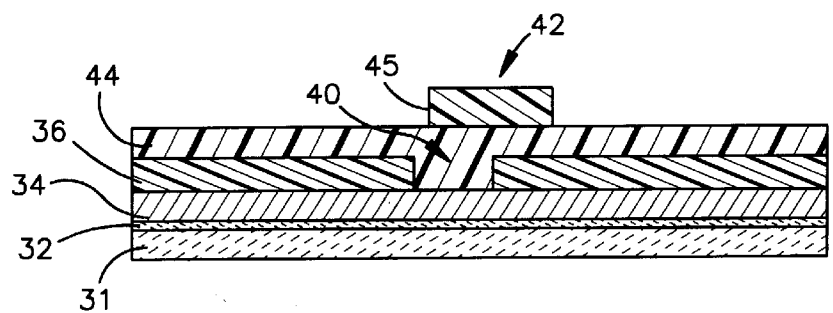
Figure 4:
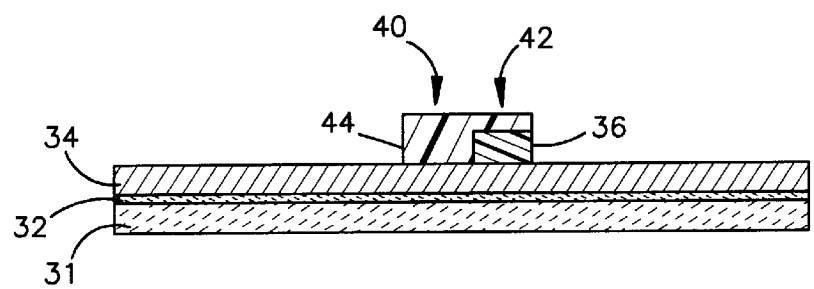
Figure 4:
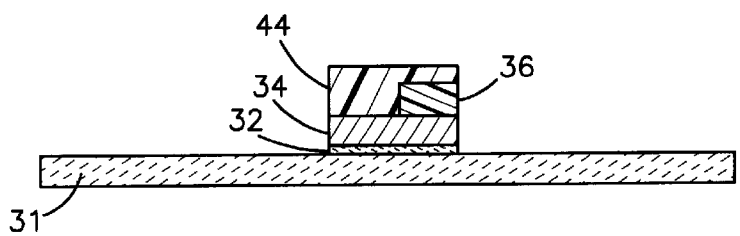
Figure 4:
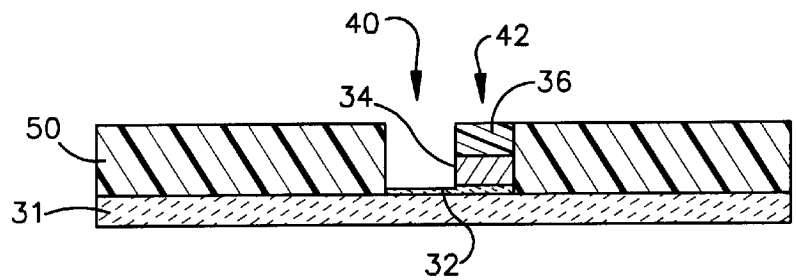
Figure 4:
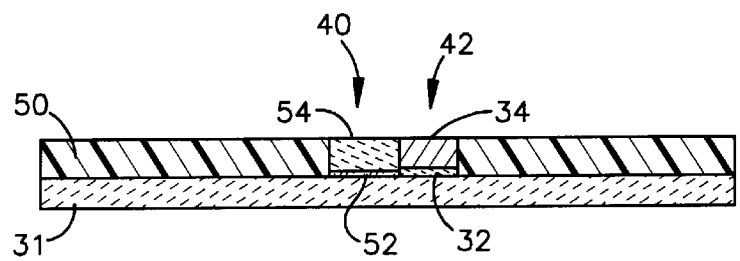

Referring to FIG. 4(1), a substrate (e.g., silicon) 31 has formed thereon a second dielectric material 32 (e.g., a material such as silicon oxide or stacked materials (collectively referred to herein as "material") such as $SiO_2$/$Si_3N_4$, etc., which is to make up gate dielectric segment GD2). A gate material 34 such as polysilicon is formed on the dielectric material 32 layer, and a first sacrificial material 36 is formed atop the gate material 34. A photo resist layer 38 is then applied to the sacrificial material 36. The photo resist layer 38 is then patterned using patterning techniques such as e-beam to form a void 40 corresponding to the length of the gate dielectric segment GD1.

Next, the first sacrificial material 36 exposed by the void 40 is etched away down to the gate material 34 and the resist layer 38 is then removed as shown in FIG. 4(2). Thereafter, a second sacrificial material 44 is deposited within the void 40 as shown in FIG. 4(3).

Subsequently, another photo resist layer is formed on the second sacrificial material 44 and is patterned and removed so as to leave a remaining resist portion 45 as shown in FIG. 4(4a). The resist portion 45 is aligned on one edge with the void 40 and extends past the other edge of the void 40 by a distance which defines the length of the gate dielectric segment GD2 which is to be formed (designated 42). Using the resist portion 45 as part of a self-align etch, the second sacrificial material 44 and the first sacrificial material 36 are etched away to expose the gate material layer 34 as shown in FIG. 4(4b).

Next, the gate material 34 and second dielectric material 32 are removed by etching again using the sacrificial material 44 as part of a self-aligned etch as represented in FIG. 4(5).

Thereafter, a gate defining material 50, such as a photo resist, polyimide, CVD oxides or other dielectric thin films, is deposited and patterned on the substrate 31 to redefine the voids 40 and 42 as represented in FIG. 4(6). Also as represented in FIG. 4(6), the second sacrificial material 44 is removed and the gate material 34 and part of the second dielectric material 32 or part layers of the dielectric if using multiple dielectric layers for 32 are etched to form first dielectric material 52 (FIG. 4(7)) in the void 40, using the second sacrificial material 36 as a mask. Optional clean and/or thermal annealing in ambient conditions may be performed after the removal of the gate material 34 to produce the first dielectric material 52. The first dielectric material 52 thus obtained may be the same material as the second dielectric material 32 but with a different thickness, or may even be a different material with a different dielectric constant.

Next, as shown in FIG. 4(7), a gate material 54 is deposited atop the first dielectric material 52. The gate material 54 may be the same material as the gate material 34, or different as will be appreciated. In addition, the first sacrificial material 36 is removed together with a portion of the gate defining material 50 (e.g., via chemical-mechanical polishing) to define a flush surface across the tops of the gate materials 54 and 34.

The first dielectric material 52 and the second dielectric material 32 respectively represent the gate dielectric segments GD1 and GD2 shown in FIG. 2. The gate materials 54 and 34 correspond, respectively, to the gate material segments (GMS and GM2 shown in FIG. 2. Although not shown, the defining material 50 is subsequently removed and the substrate 31 processed 1o define the source and drain regions as is conventional.

Figure 5:
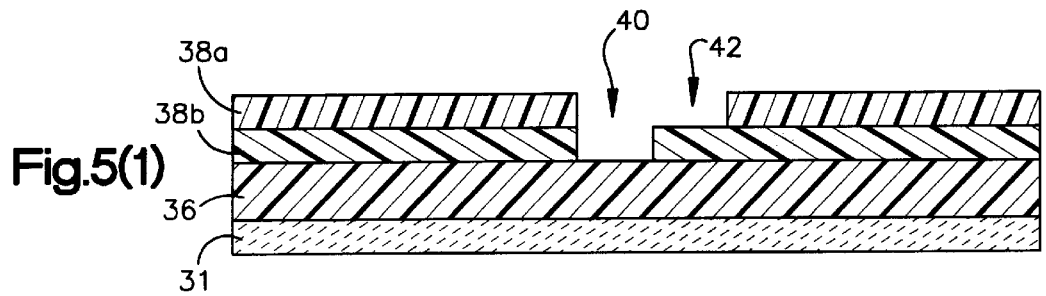
FIGS. 5(1)–5(5) represent typical process steps associated with using nitride ion implantation techniques in accordance with the present invention.
Figure 5:
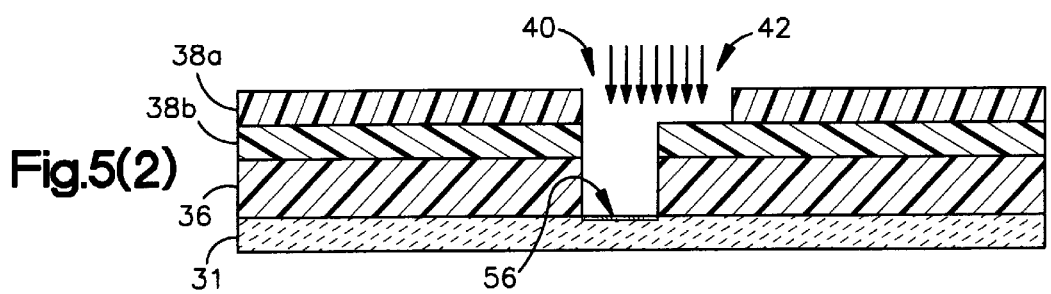
Figure 5:
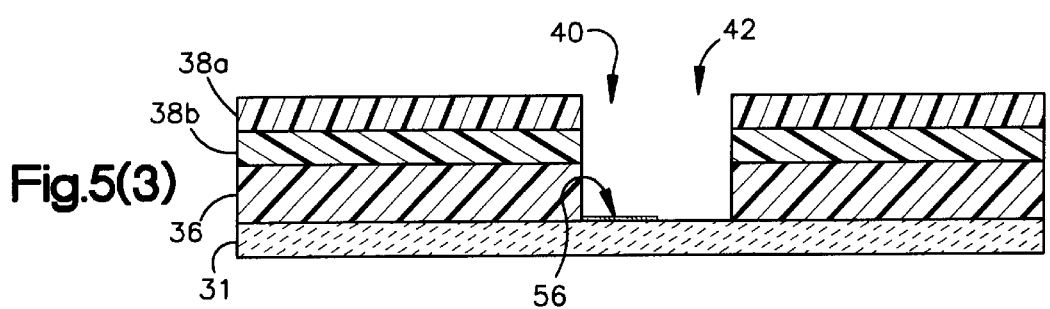
Figure 5:
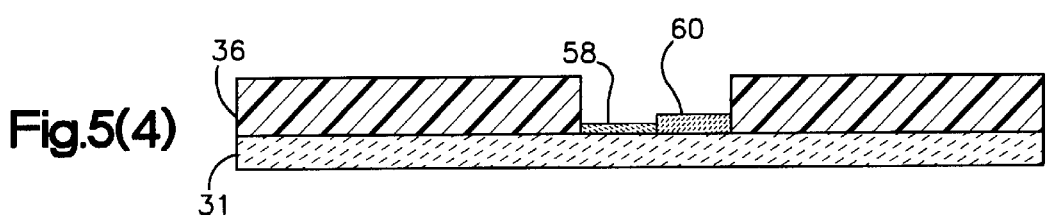
Figure 5:
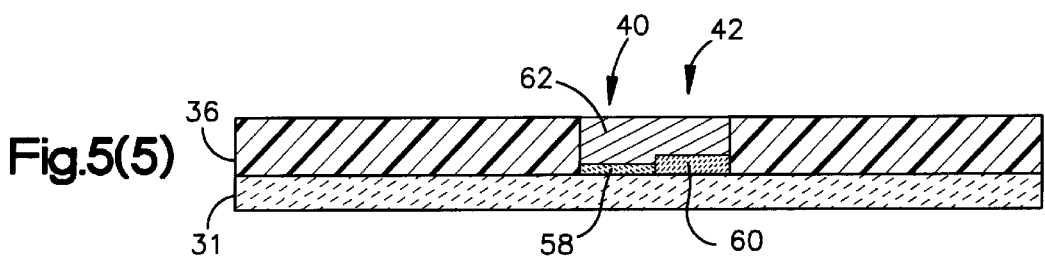

Using differential oxidation, FIGS. 5(1)–5(5) illustrate another technique for forming a non-uniform gate dielectric in accordance with the present invention. A sacrificial material 36 is initially formed on a substrate 31 followed by photo resist layers 38a and 38b as represented in FIG. 5(1). The photo resist layers 38a and 38b are patterned and etched using patterning techniques to form voids 40 and 42 corresponding to the length of the gate dielectric segments GD1 and GD2.

Next, as shown in FIG. 5(2) the sacrificial material 36 in the region of the void 40 is removed using conventional techniques. Nitride ion implantation is then performed so as to implant nitride ions 56 at the surface of the substrate 31 where the gate dielectric segment GD1 is to be formed. Alternatively, other species such as C, Ge, etc. may be used in addition to Nitride as part of the ion implantation step.

As represented in FIG. 5(3), the photo resist layer 38b and the sacrificial material 36 are then etched away within the void 42 to expose the substrate 31 in preparation for forming the gate dielectric segment GD2. In FIG. 5(4), the photoresist layers are removed and differential oxidation is performed such that oxide gate dielectrics 58 and 60 are formed. The gate dielectrics 58 and 60 consequently will have different thicknesses and/or dielectric constants due to the nitride ion implant. As in the other examples described herein, by controlling the relative thicknesses and/or dielectric constants of the gate materials the desired FET structure may be obtained.

Next, a gate material 62 is formed on top of the gate dielectrics 58 and 60 so as to fill the voids 40 and 42 flush with the surface of the sacrificial material 36 as shown in FIG. 5(5). Accordingly, in this particular example the same gate material 62 is used to form both gate material segments GM1 and GM2 corresponding to FIG. 2. The non-uniform gate dielectrics 58 and 60 correspond to the gate dielectric segments GD1 and GD2 as will be appreciated.

Although not shown, the remaining sacrificial material 36 is then removed and the substrate 31 processed to form source and drain regions using conventional processes to complete the FET.

Figure 6:
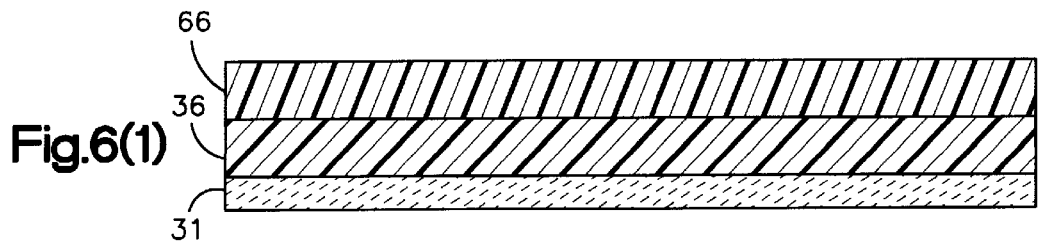
FIGS. 6(1)–6(4) illustrate typical process steps involved using angle ion implantation in accordance with the present invention.
Figure 6:
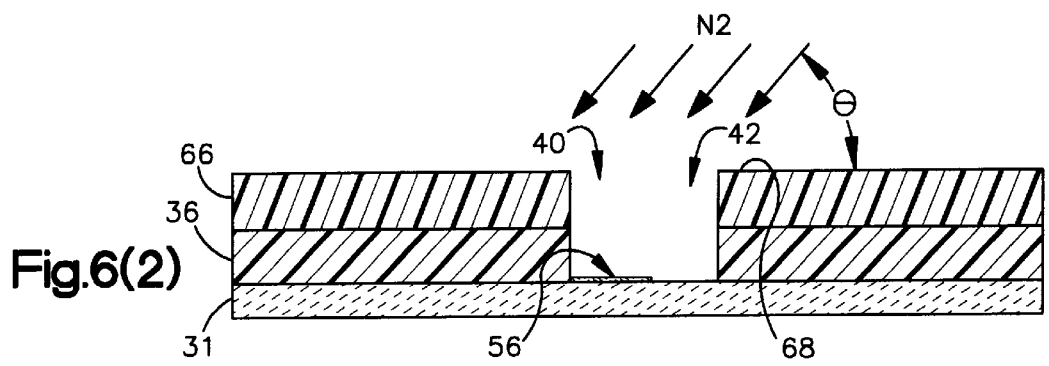
Figure 6:
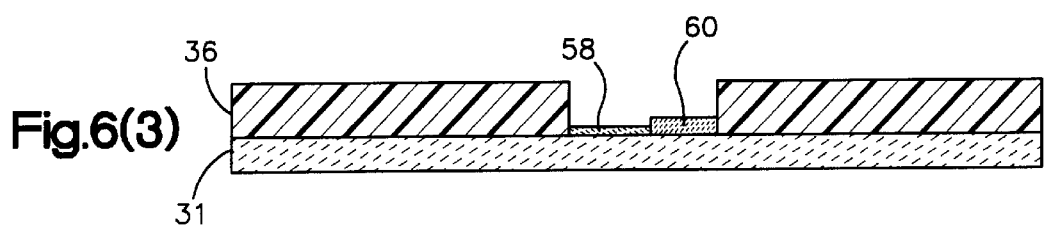
Figure 6:
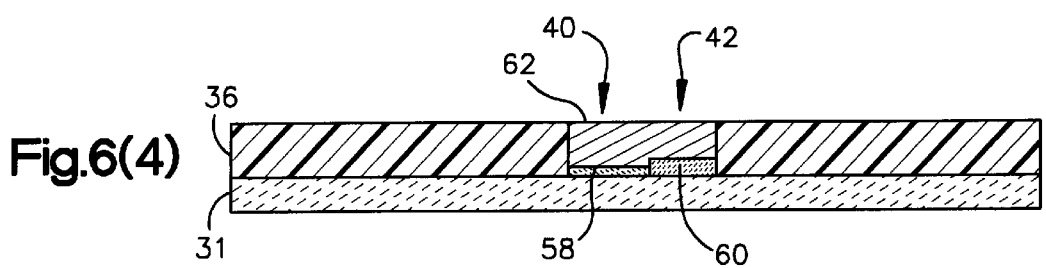

FIGS. 6(1)–6(4) illustrate a technique for forming the FET structure using angle ion implantation. Referring initially to FIG. 6(1), a sacrificial material 36 and photo resist layer 66 are formed initially on the substrate 31. As represented in FIG. 6(2), the photo resist layer 66 is then patterned to define the gate area for the FET. In addition, the sacrificial material 36 is etched to expose the substrate 31 by creating voids 40 and 42 corresponding to the length of the gate dielectric segments GD1 and GD2 as in the previous examples. Thereafter, the substrate is subjected to angle nitride ion implantation as also represented in FIG. 6(2).

The nitride ions are directed towards the substrate 31 at a predetermined angle θ. The precise angle θ is selected based on the known depth of the voids 40, 42 such that nitride ions are incident on the surface of the substrate 31 only at the base of the void 40. Nitride ions are prevented from striking the surface of the substrate 31 at the base of the void 42 by the edge 68 of the photo resist layer 66. The nitride ions are implanted in the substrate at the base of the void 40 as represented by 56. Again, other species such as C, Ge, etc. can also be used for forming the differential oxides in addition to Nitride.

Next, differential oxidation is performed as represented in FIG. 6(3). The differential oxidation is performed in the same manner discussed above in relation to FIG. 5(4) so as to form non-uniform gate dielectrics 58 and 60. A gate material 62 is then added to complete the relevant structure similar to that described above in relation to FIG. 5(5).

Figure 7:
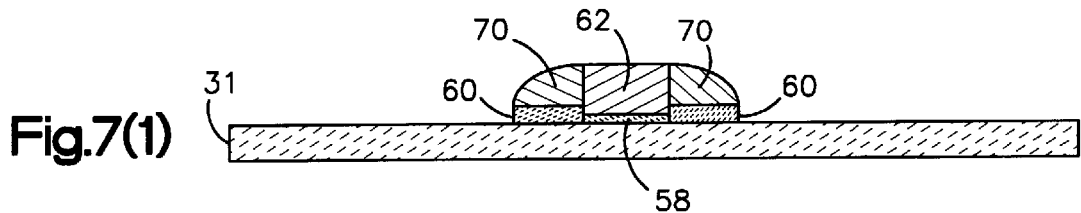
FIGS. 7(1)–7(3) represent typical process steps carried out using precise alignment methods in accordance with the present invention.
Figure 7:
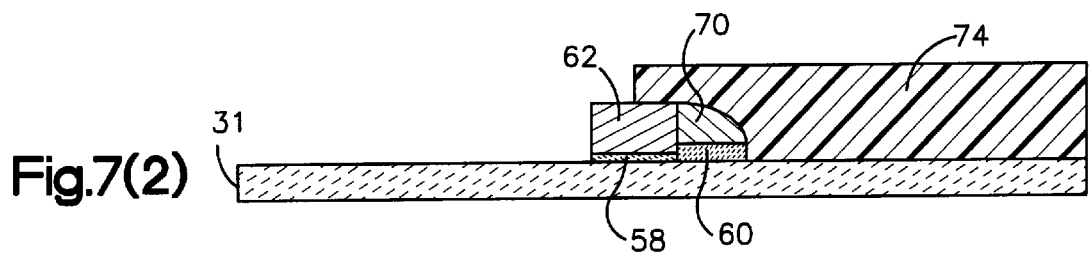
Figure 7:
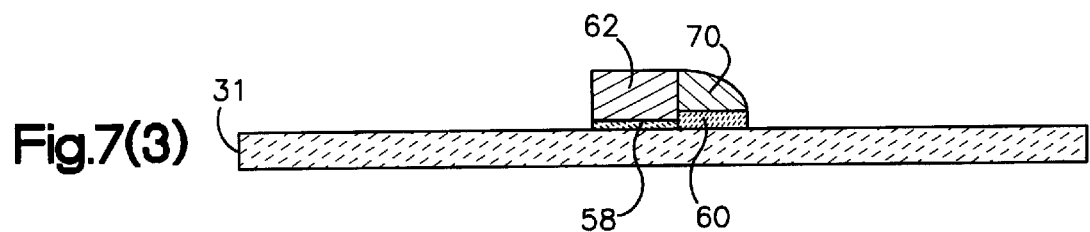

FIGS. 7(1)–7(3) represent a technique for forming the FET structure using a conventional LDD process. As represented in FIG. 7(1), a first dielectric material 58 (e.g., oxide) and first gate material 62 are formed on the substrate 31. The respective layers are then patterned and etched to define a conventional gate structure represented by the first dielectric material 58 interposed between the first gate material 62 and the substrate 31. Continuing to refer to FIG. 7(1), a second dielectric material 60 (e.g., oxide) having Et thickness and/or dielectric constant different from the first dielectric material 58 is formed on top of the first gate material 62 and substrate 31.

Unlike a conventional LDD process where simply an oxide layer is formed, a second gate material 70 is then formed on top of the second dielectric material 60. The second gate material 70 may be the same or different from the first gate material 62 as desired. Next, the conventional LDD process is continued whereby the second gate material 70 and dielectric material 60 are etched to form sidewall spacers made up of the second gate material 70 and the dielectric material 60 as represented by the structure shown in FIG. 7(1). Whereas a finished transistor illustrated in 7(1) is covered by this invention, further modification may be made.

Referring to FIG. 7(2), a photo resist is then formed and patterned to form a mask 74 which covers the gate material 62 and one of the sidewall spacers formed by the second gate material 70 and the dielectric material 60 as shown. The exposed opposite sidewall spacer including the other portion of the second gate material 70 and dielectric material 60 are then removed via etching as shown in FIG. 7(2). Thereafter, the remaining photo resist mask 74 is removed resulting in the structure shown in FIG. 7(3), resulting in an asymmetric transistor structure.

As will be appreciated, the dielectric materials 58 and 60 correspond to the gate dielectrics GD1 and GD2 of the structure shown in FIG. 2. The gate materials 62 and 70 correspond to the gate materials GM1 and GM2 represented in FIG. 2. Subsequent processing includes forming the source, drain and LDD sidewall spacers (if desired) to result in the completed FET structure.

It will therefore be understood that an FET in accordance with the present invention is typified by a structure in which the gate dielectric thickness and/or dielectric constant varies along the length of the channel. This results in a variation in the vertical electric field which has been found to suppress short-channel effects. The gate dielectric may have multiple thickness and/or dielectric constant changes along the channel to optimize the device performance, manufacturability, etc. Various exemplary structures are described together with a variety of exemplary manufacturing techniques. Such examples are not intended to be limiting in scope, as it will be understood that there are countless other structures and methods for making such structures. Rather, such examples are provided to illustrate the utility of the present invention in combination with the simplicity of its manufacture.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A transistor comprising:
 a semiconductor substrate;
 a source region and a drain region formed within the semiconductor substrate;
 a channel region defined within the semiconductor substrate extending between the source region and the drain region;
 a gate dielectric layer formed on the substrate above the channel region, the gate dielectric layer having a non-uniform thickness along a length of the channel region; and
 a gate material layer formed above the gate dielectric layer;
 wherein the transistor is an N-type metal-oxide-semiconductor (NMOS) transistor, and the thickness of the gate dielectric layer decreases along the channel region from the source region to the drain region.

2. A transistor comprising:
 a semiconductor substrate;
 a source region and a drain region formed within the semiconductor substrate;
 a channel region defined within the semiconductor substrate extending between the source region and the drain region;
 a gate dielectric layer formed on the substrate above the channel region, the gate dielectric layer having a non-uniform thickness along a length of the channel region; and
 a gate material layer formed above the gate dielectric layer;
 wherein the transistor is an P-type metal-oxide-semiconductor (PMOS) transistor, and the thickness of the gate dielectric layer decreases along the channel region from the source region to the drain region.

3. A transistor comprising:
 a semiconductor substrate;
 a source region and a drain region formed within the semiconductor substrate;
 a channel region defined within the semiconductor substrate extending between the source region and the drain region;
 a gate dielectric layer formed on the substrate above the channel region, the gate dielectric layer having a non-uniform thickness along a length of the channel region; and
 a gate material layer formed above the gate dielectric layer;
 wherein a thickness of the gate dielectric layer towards a center of the channel region is greater than a thickness of the gate dielectric layer towards the ends of the channel region.

4. A transistor comprising:
 a semiconductor substrate;
 a source region and a drain region formed within the semiconductor substrate;
 a channel region defined within the semiconductor substrate extending between the source region and the drain region;
 a gate dielectric layer formed on the substrate above the channel region, the gate dielectric layer having a non-uniform dielectric constant along the length of the channel region; and
 a gate material layer formed above the gate dielectric layer.

5. The transistor of claim 4, wherein the transistor is an N-type metal-oxide-semiconductor (NMOS) transistor, and the dielectric constant of the gate dielectric layer increases along the channel region from the source region to the drain region.

6. The transistor of claim 4, wherein the transistor is an N-type metal-oxide-semiconductor (NMOS) transistor, and the dielectric constant of the gate dielectric layer decreases along the channel region from the source region to the drain region.

7. The transistor of claim 4, wherein the transistor is an P-type metal-oxide-semiconductor (PMOS) transistor, and the dielectric constant of the gate dielectric layer decreases along the channel region from the source region to the drain region.

8. The transistor of claim 4, wherein the transistor is an P-type metal-oxide-semiconductor (PMOS) transistor, and the dielectric constant of the gate dielectric layer increases along the channel region from the source region to the drain region.

9. The transistor of claim 4, wherein a dielectric constant of the gate dielectric layer towards a center of the channel region is greater than a dielectric constant of the gate dielectric layer towards the ends of the channel region.

10. The transistor of claim 4, wherein a dielectric constant of the gate dielectric layer towards a center of the channel region is less than a dielectric constant of the gate dielectric layer towards the ends of the channel region.

11. A transistor comprising:
 a semiconductor substrate;
 a source region and a drain region formed within the semiconductor substrate;
 a channel region defined within the semiconductor substrate extending between the source region and the drain region;
 a gate dielectric layer formed on the substrate above the channel region, the gate dielectric layer having at least one of a non-uniform thickness and a non-uniform dielectric constant along a length of the channel region; and
 a gate material layer formed above the gate dielectric layer;
 wherein the gate dielectric layer comprises a plurality of different gate dielectric materials disposed adjacent each other along the channel.

12. The transistor of claim 11, wherein the plurality of different gate dielectric materials have non-uniform thicknesses.

13. The transistor of claim 11, wherein the gate dielectric layer has a non-uniform thickness along the length of the channel region.

14. The transistor of claim 13, wherein the transistor is an N-type metal-oxide-semiconductor (NMOS) transistor, and the thickness of the gate dielectric layer increases along the channel region from the source region to the drain region.

15. The transistor of claim 13, wherein the transistor is an P-type metal-oxide-semiconductor (PMOS) transistor, and the thickness of the gate dielectric layer increases along the channel region from the source region to the drain region.

16. The transistor of claim 11, wherein the plurality of gate dielectric materials have non-uniform dielectric constants.

17. The transistor of claim 11, wherein at least one of the plurality of different gate dielectric materials is made up of a vertical stack of different dielectric materials.

18. The transistor of claim 11, wherein the gate material is uniform along the channel.

19. A transistor comprising:
   a semiconductor substrate;
   a source region and a drain region formed within the semiconductor substrate;
   a channel region defined within the semiconductor substrate extending between the source region and the drain region;
   a gate dielectric layer formed on the substrate above the channel region, the gate dielectric layer having at least one of a non-uniform thickness and a non-uniform dielectric constant along a length of the channel region; and
   a gate material layer formed above the gate dielectric layer;
   wherein a work function of the gate material layer is non-uniform along the channel.

20. The transistor of claim 19, wherein the gate material layer comprises a plurality of different gate materials disposed adjacent each other along the channel.

21. The transistor of claim 19, wherein the plurality of different gate materials have non-uniform thickness.

* * * * *